(12) United States Patent
Thees et al.

(10) Patent No.: US 10,923,579 B2
(45) Date of Patent: Feb. 16, 2021

(54) SEMICONDUCTOR DEVICE WITH INTERCONNECT TO SOURCE/DRAIN

(71) Applicant: GLOBALFOUNDRIES U.S. Inc., Grand Cayman (KY)

(72) Inventors: Hans-Juergen Thees, Dresden (DE); Peter Baars, Dresden (DE); Elliot John Smith, Dresden (DE)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/854,552

(22) Filed: Apr. 21, 2020

(65) Prior Publication Data

US 2020/0251576 A1 Aug. 6, 2020

Related U.S. Application Data

(62) Division of application No. 15/897,570, filed on Feb. 15, 2018, now Pat. No. 10,707,330.

(51) Int. Cl.
| | | |
|---|---|---|
| *H01L 21/762* | (2006.01) | |
| *H01L 29/66* | (2006.01) | |
| *H01L 29/49* | (2006.01) | |
| *H01L 29/786* | (2006.01) | |
| *H01L 29/423* | (2006.01) | |
| *H01L 21/285* | (2006.01) | |

(Continued)

(52) U.S. Cl.
CPC .. *H01L 29/66772* (2013.01); *H01L 21/28587* (2013.01); *H01L 21/3081* (2013.01); *H01L 21/30604* (2013.01); *H01L 21/76224* (2013.01); *H01L 27/1211* (2013.01); *H01L 29/42392* (2013.01); *H01L 29/4908* (2013.01); *H01L 29/66818* (2013.01); *H01L 29/78606* (2013.01); *H01L 29/78696* (2013.01); *H01L 21/76283* (2013.01); *H01L 21/823481* (2013.01); *H01L 21/823878* (2013.01)

(58) Field of Classification Search
CPC .......... H01L 21/30604; H01L 21/3081; H01L 21/7624; H01L 21/76224; H01L 21/76264; H01L 21/76283; H01L 21/823878; H01L 21/823481; H01L 27/1203; H01L 27/1211; H01L 29/42392; H01L 29/4908; H01L 29/66772; H01L 29/66818; H01L 29/78606; H01L 29/78696
See application file for complete search history.

(56) References Cited

U.S. PATENT DOCUMENTS

| | | |
|---|---|---|
| 4,604,162 A | 8/1986 | Sobczak |
| 5,250,836 A | 10/1993 | Miura et al. |

(Continued)

*Primary Examiner* — Mary A Wilczewski
(74) *Attorney, Agent, or Firm* — Francois Pagette; Hoffman Warnick LLC

(57) ABSTRACT

A device including an SOI substrate and an isolation structure positioned at least partially in a trench that extends through a buried insulation layer and into a semiconductor bulk substrate of the SOI substrate is disclosed. The isolation structure includes a first dielectric layer positioned in a lower portion of the trench, a first material layer positioned above the first dielectric layer, the first material layer having a material different from a material of the first dielectric layer, and a second dielectric layer positioned above the first material layer, the second dielectric layer having a material different from the material of the first material layer.

12 Claims, 10 Drawing Sheets

(51) Int. Cl.
  *H01L 27/12* (2006.01)
  *H01L 21/306* (2006.01)
  *H01L 21/308* (2006.01)
  *H01L 21/8238* (2006.01)
  *H01L 21/8234* (2006.01)

(56) References Cited

U.S. PATENT DOCUMENTS

| | | | |
|---|---|---|---|
| 5,480,832 A | 1/1996 | Miura et al. |
| 5,496,765 A | 3/1996 | Schwalke |
| 5,559,357 A | 9/1996 | Krivokapic |
| 5,607,875 A | 3/1997 | Nishizawa et al. |
| 5,700,712 A | 12/1997 | Schwalke |
| 6,333,232 B1 | 12/2001 | Kunikiyo |
| 6,440,817 B2 | 8/2002 | Trivedi |
| 6,465,296 B1 | 10/2002 | Quek et al. |
| 6,524,928 B1 | 2/2003 | Hirabayashi |
| 6,524,929 B1 | 2/2003 | Xiang et al. |
| 6,528,379 B2 | 3/2003 | Takada et al. |
| 6,576,949 B1 | 6/2003 | Park |
| 6,653,674 B2 | 11/2003 | Quek et al. |
| 6,657,276 B1 | 12/2003 | Karlsson et al. |
| 6,737,706 B2 | 5/2004 | Lee et al. |
| 6,780,728 B2 | 8/2004 | Tran |
| 6,979,627 B2 | 12/2005 | Yeap et al. |
| 7,230,270 B2 | 6/2007 | Chen et al. |
| 7,316,981 B2 | 1/2008 | Fucsko et al. |
| 7,491,622 B2 | 2/2009 | Turner et al. |
| 7,528,078 B2 | 5/2009 | Van Gompel et al. |
| 7,670,895 B2 | 3/2010 | Van Gompel et al. |
| 8,168,507 B2 | 5/2012 | Ho et al. |
| 8,298,907 B2 | 10/2012 | Ho et al. |
| 8,492,838 B2 | 7/2013 | Dennard et al. |
| 8,637,365 B2 | 1/2014 | Cheng et al. |
| 8,703,550 B2 | 4/2014 | Doris et al. |
| 8,981,480 B2 | 3/2015 | Lim et al. |
| 9,059,244 B2 | 6/2015 | Cai et al. |
| 9,171,757 B2 | 10/2015 | Doris et al. |
| 9,252,052 B2 | 2/2016 | Doris et al. |
| 9,343,527 B2 | 5/2016 | Yagami et al. |
| 9,368,386 B2 | 6/2016 | Tan et al. |
| 9,502,292 B2 | 11/2016 | Doris et al. |
| 9,502,586 B1 | 11/2016 | Kim et al. |
| 9,899,257 B1 | 2/2018 | Wallner et al. |
| 10,483,154 B1 * | 11/2019 | Smith ............... H01L 21/76283 |
| 2001/0050397 A1 | 12/2001 | Matsumoto et al. |
| 2002/0025654 A1 | 2/2002 | Arita et al. |
| 2003/0020117 A1 | 1/2003 | Lee et al. |
| 2003/0040187 A1 | 2/2003 | Kotani |
| 2003/0153136 A1 | 8/2003 | Matsumoto et al. |
| 2004/0026746 A1 | 2/2004 | Nakazawa et al. |
| 2005/0145937 A1 | 7/2005 | Chen et al. |
| 2013/0334651 A1 | 12/2013 | Doris et al. |
| 2017/0084628 A1 | 3/2017 | Kim et al. |

\* cited by examiner

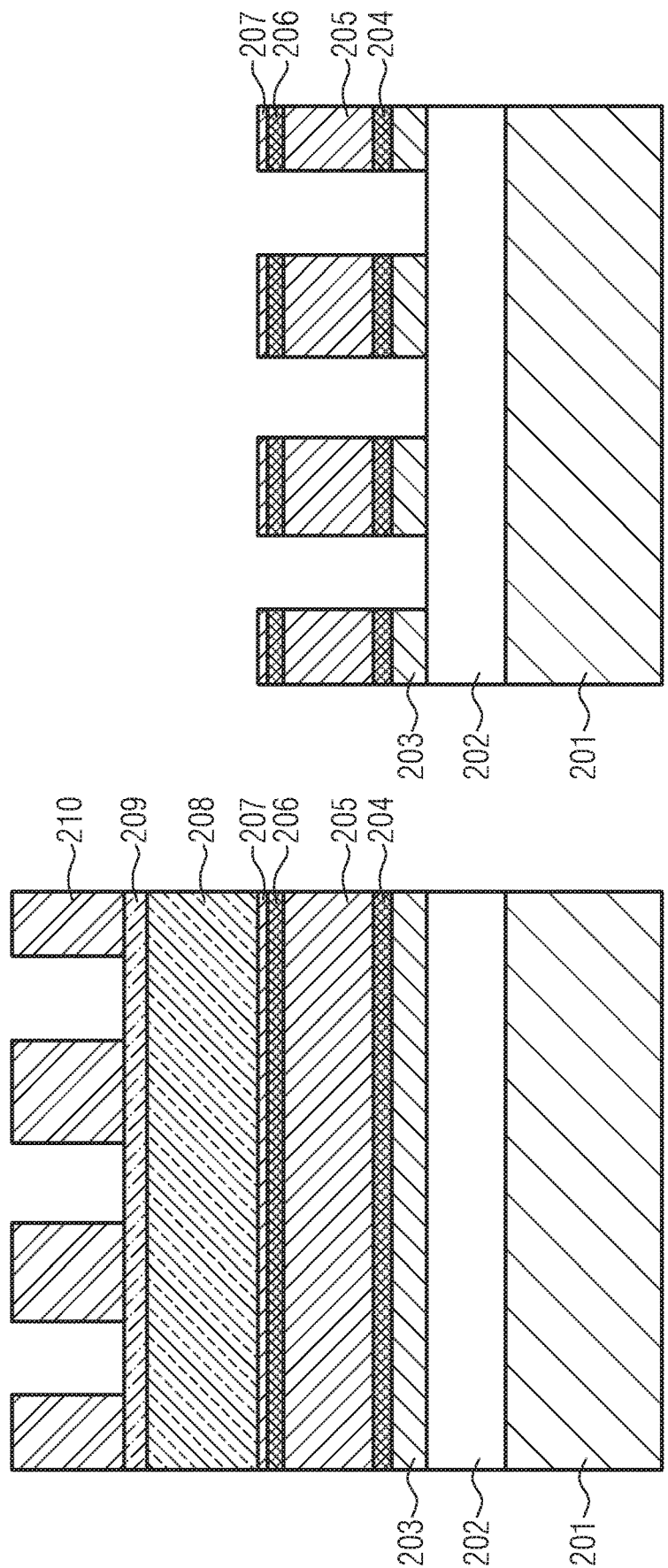

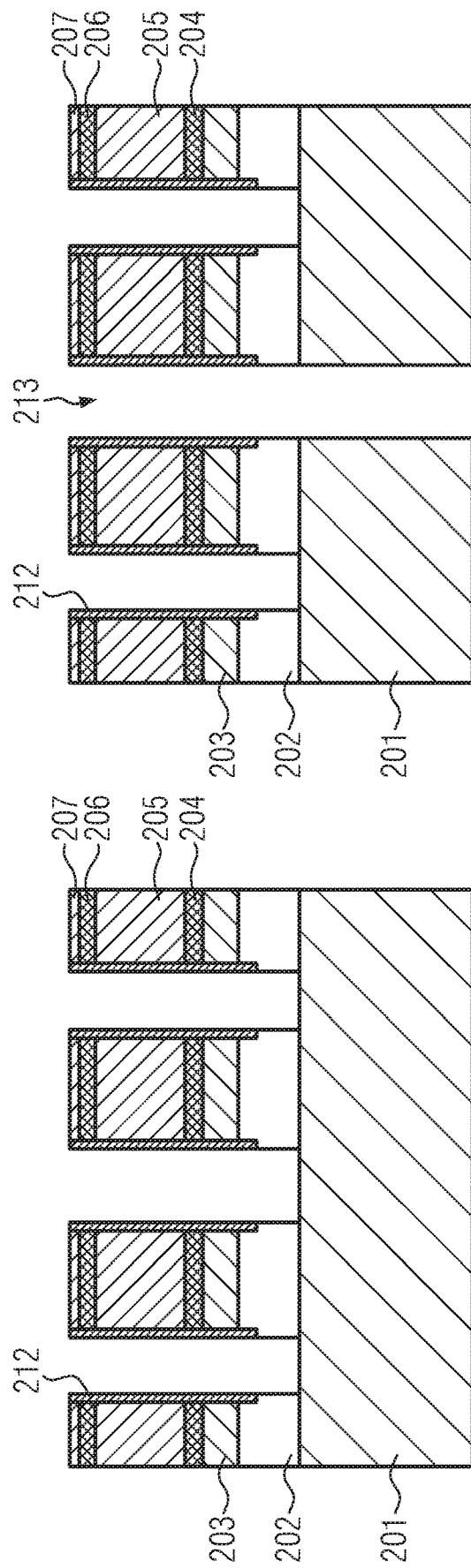

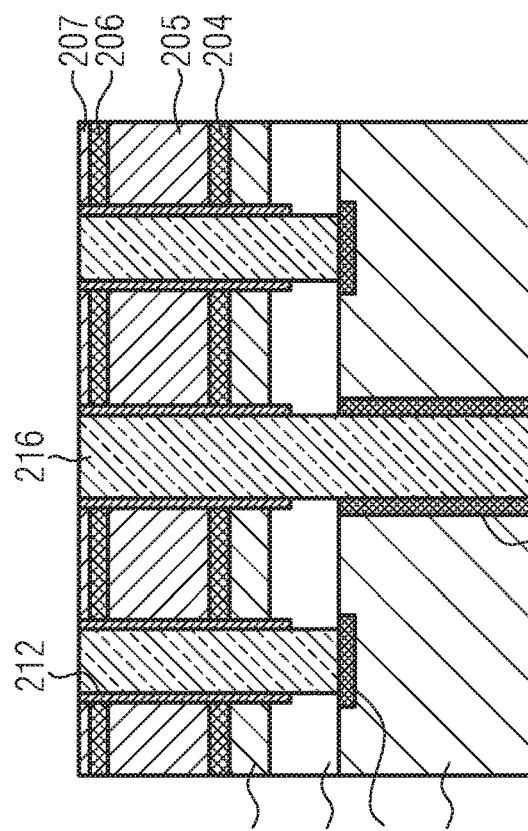
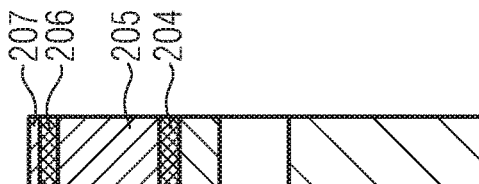
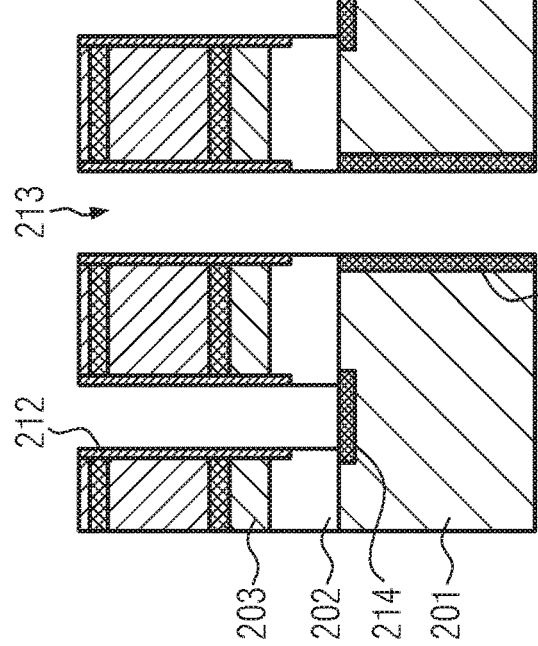
FIG. 2f
FIG. 2e

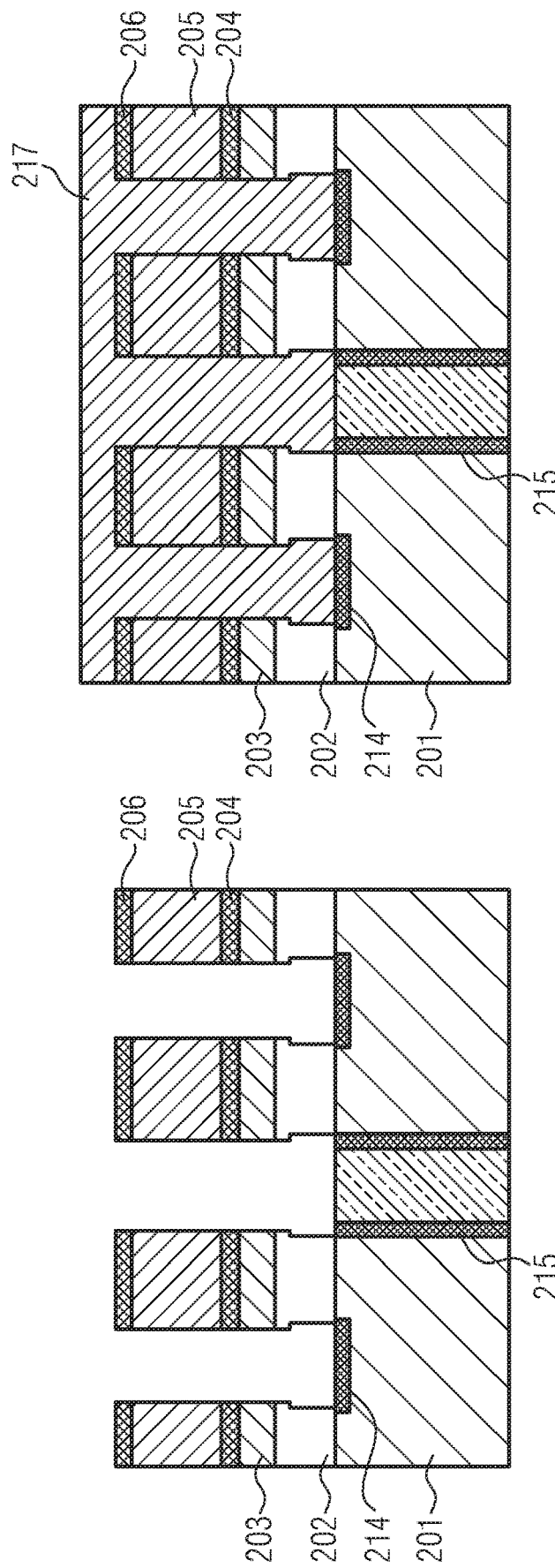

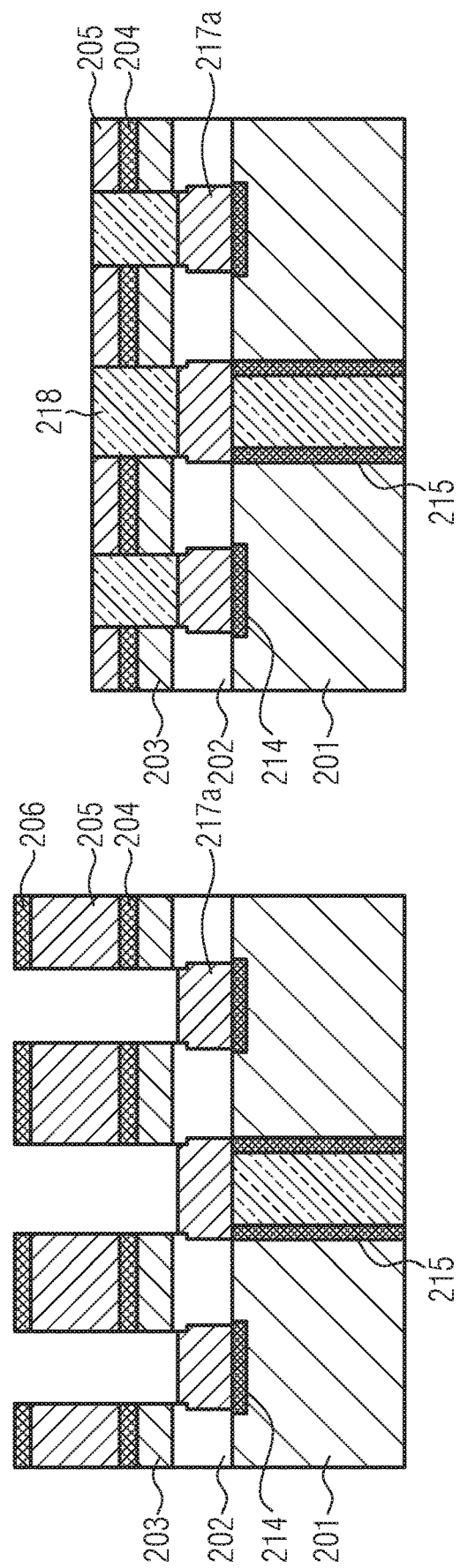

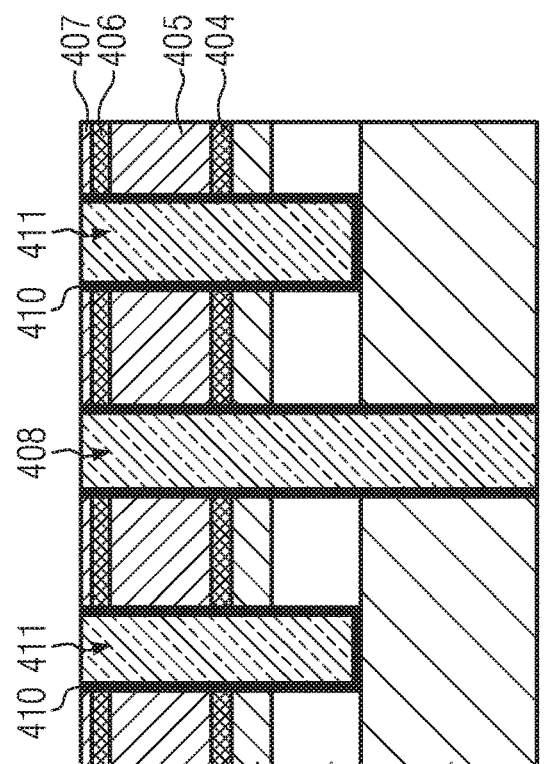
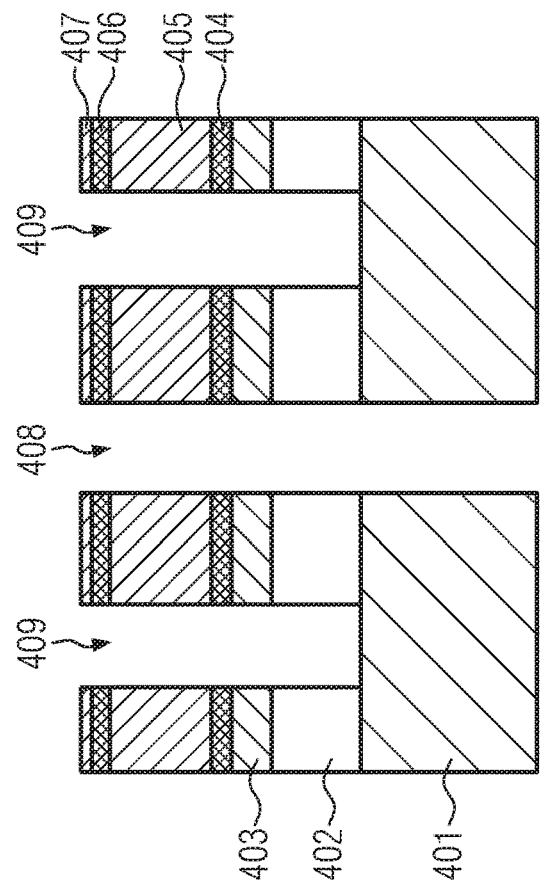
FIG. 4b
FIG. 4a

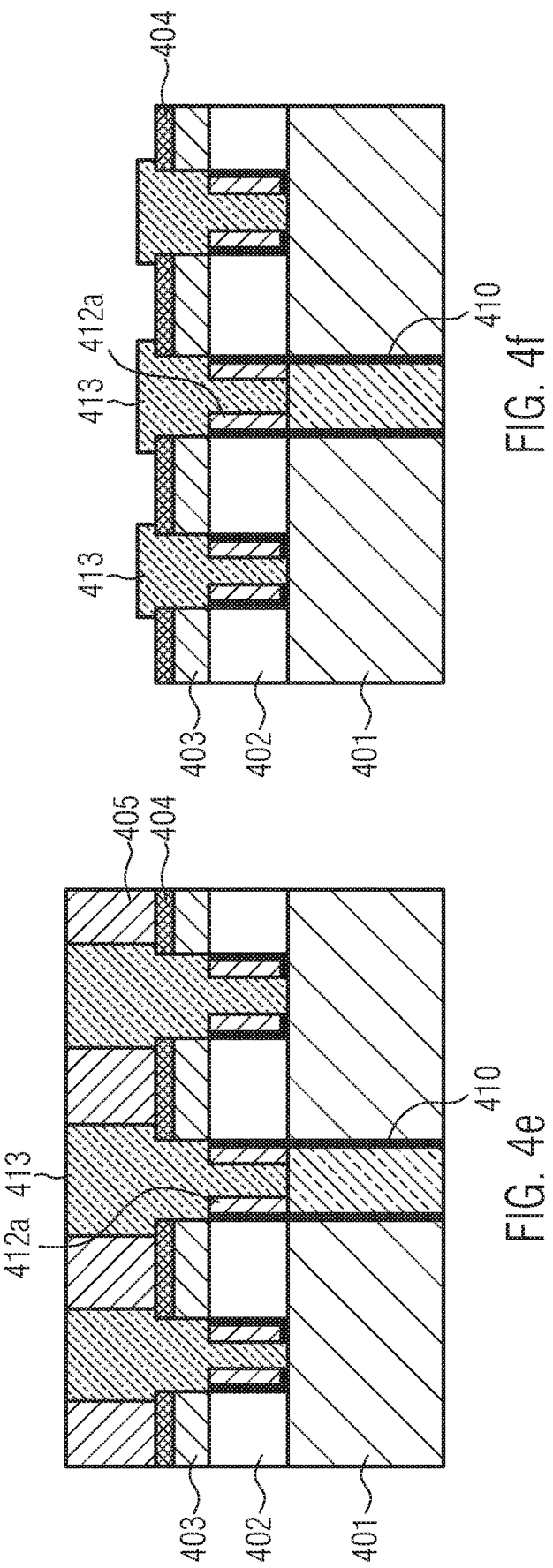

SEMICONDUCTOR DEVICE WITH INTERCONNECT TO SOURCE/DRAIN

BACKGROUND

Field of the Disclosure

Generally, the present disclosure relates to the field of integrated circuits and semiconductor devices and, more particularly, to (local) interconnects/electrical contacts to source/drain regions of transistor devices.

Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, MOS technology is currently one of the most promising approaches due to the superior characteristics in view of operating speed and/or power consumption and/or cost efficiency. During the fabrication of complex integrated circuits using, for instance, CMOS technology, millions of N-channel transistors and P-channel transistors are formed on a substrate including a crystalline semiconductor layer.

Nowadays, FETs are usually built on silicon-on-insulator (SOI), in particular fully depleted silicon-on-insulator (FD-SOI), substrates. The channels of the FETs are formed in thin semiconductor layers, typically including or made of silicon material, wherein the semiconductor layers are formed on insulating layers, buried insulation (BOX) layers, that are formed on semiconductor bulk substrates.

Due to the large number of transistor devices in modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or substantially vertically oriented connections, which are also referred to as vias. These vertical interconnect structures comprise an appropriate metal and provide the electrical substantially connection of the various stacked metallization layers. In order to actually connect the circuit elements formed in the semiconductor material with the metallization layers, an appropriate substantially vertically oriented contact structure is provided, a first end of which is connected to a respective contact region of a circuit element, such as a gate electrode and/or the drain and source regions of transistors, and a second end that is connected to a respective metal line in the metallization layer. In some applications, the second end of the contact structure may be connected to a contact region of a further semiconductor-based circuit element, in which case the interconnect structure in the contact level is also referred to as a local interconnect. The contact structure may comprise contact elements or contact plugs having a generally square-like or round shape that are formed in some interlayer dielectric (ILD) material.

In advanced configurations, raised source and drain regions of transistor devices can be contacted by means of combined trench silicide (TS) structures positioned on a gate electrode level and CA contact structures positioned in an insulating layer formed above the gate electrodes and contacting the TS structures, for example. Moreover, CA contact structures may directly contact source/drain regions of FETs or may contact source/drain regions via TS structures.

However, contacting electrodes of transistor devices poses an increasing problem due to the aggressive overall downscaling. In fact, the engineers face severe scaling and patterning limitations. In particular, in 22 nm manufacturing technologies, problems occur with respect to contact holes etched through the buried insulation layer of an SOI substrate adjacent to shallow trench isolations (STIs), resulting in CA contacts creating shorts to the semiconductor bulk substrate of the SOI substrate. In order to avoid such shorts in 22 nm technologies, it was proposed to arrange the CA contacts over active regions without overlap of STI regions. However, in sub-22 nm, for example, 12 nm, technologies, due to the highly-reduced critical dimensions, design rules demand for some overlap of CA contacts and STI regions.

In view of the situation described above, the present disclosure provides means for reliably forming contacts, in particular, local interconnecting structures, for electrically connecting source/drain regions of FETs without a risk of forming electrical shorts to the bulk substrate of the SOI substrate.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to semiconductor devices comprising SOI FETs, wherein source/drain regions are contacted by interconnects (contacts) adjacent to isolation regions, in particular, shallow trench isolations (STIs).

A method of manufacturing a semiconductor device as disclosed herein includes the steps of providing an SOI substrate comprising a semiconductor bulk substrate, a buried insulation layer that may be comprised of a variety of different insulating materials, e.g., a silicon dioxide, hereinafter generically referred to as a "BOX" layer formed on the semiconductor bulk substrate and a semiconductor layer formed on the buried insulation layer, forming a shallow trench isolation (STI) in the SOI substrate, forming a FET in and over the SOI substrate, and forming a contact to a source or drain region of the FET, the source or drain region being positioned adjacent to the STI. The step of forming the shallow trench isolation includes: (a) forming a trench in the SOI substrate; (b) filling a lower portion of the trench with a first dielectric layer, the first dielectric layer, for example, being made of a flowable oxide material; (c) forming a buffer layer, for example, comprising or made of a nitride material (particularly, silicon nitride, for example, $Si_3N_4$), over the first dielectric layer, the buffer layer having a material different from the material of the first dielectric layer; and (d) forming a second dielectric layer, for example, an oxide layer, over the buffer layer and made of a material different from the material of the buffer layer.

The buffer layer may be formed at the BOX level over the semiconductor bulk substrate of the SOI substrate. The second dielectric layer may be formed at the semiconductor layer level and may extend partially below the upper surface of the buried insulation layer.

Further, a method of manufacturing a semiconductor device is provided including the steps of providing an SOI substrate comprising a semiconductor bulk substrate, a buried insulation layer formed on the semiconductor bulk substrate and a semiconductor layer formed on the buried insulation (BOX) layer, forming a shallow trench isolation (STI) in the SOI substrate, forming a FET in and over the SOI substrate, and forming a contact to a source or drain region of the FET, the source or drain region being positioned adjacent to the STI. The step of forming the shallow trench isolation includes: (a) forming a trench in the SOI substrate; (b) filling a lower portion of the trench with a first dielectric layer (for example, made of a flowable oxide material); (c) forming a spacer layer (for example, made of a silicon nitride material) over the first dielectric layer and over sidewalls of the trench, the spacer layer having a material different from the material of the first dielectric layer; and (d) forming a second dielectric layer (for example, made of an oxide material) over the spacer layer, the second dielectric layer having a material different from the material of the spacer layer. The spacer layer is formed only at the sidewalls of the trench and, thus, does not extend over the entire width of the trench. Moreover, the spacer layer may be formed at the BOX level above the upper surface of the semiconductor bulk substrate.

The spacer layer may be formed at the BOX level over the semiconductor bulk substrate of the SOI substrate. The second dielectric layer may be formed at the semiconductor layer level and may extend partially below the upper surface of the buried insulation layer.

Furthermore, a semiconductor device is provided including an SOI substrate comprising a semiconductor bulk substrate, a buried insulation layer formed on the semiconductor bulk substrate and a semiconductor layer formed on the buried insulation layer, a shallow trench isolation (STI) formed in the SOI substrate, a FET formed in and over the SOI substrate, and a contact (interconnect) contacting one of a source and a drain region of the FET, the source or drain region being positioned adjacent to the shallow trench isolation. The shallow trench isolation comprises a trench formed in the SOI substrate, a first dielectric layer, for example, made of a flowable oxide material, filled in a lower portion of the trench (and, thereby, covering the bottom of the trench), a first material layer formed over the first dielectric layer, the first material layer (for example, made of an oxide material) having a material different from the material of the first dielectric layer, and a second dielectric layer (for example, made of an oxide material) formed over the first material layer and made of a material different from the material of the first material layer.

The first material layer may be formed at the BOX level over the semiconductor bulk substrate of the SOI substrate. The second dielectric layer may be formed at the semiconductor layer level and may extend partially below the upper surface of the buried insulation layer.

The first material layer may comprise spacer layers formed over sidewalls of the trench and a second material layer formed between the spacer layers and of a material different from the material of the spacer layers.

Furthermore, a semiconductor device is provided including an SOI substrate comprising a semiconductor bulk substrate, a buried insulation layer formed on the semiconductor bulk substrate and a semiconductor layer formed on the buried insulation layer, a shallow trench isolation (STI) formed in the SOI substrate, a FET formed in and over the SOI substrate, and a contact contacting one of a source and a drain region of the FET, the source or drain region being positioned adjacent to the shallow trench isolation. The shallow trench isolation comprises a trench formed in the SOI substrate, a first dielectric layer, for example, made of a flowable oxide material, filled in a lower portion of the trench (and, thereby, covering the bottom of the trench), a spacer layer formed over the first dielectric layer and over sidewalls of the trench, the spacer layer (for example, made of a silicon nitride material) having a material different from the material of the first dielectric layer, and a second dielectric layer (for example, made of an oxide material) formed over the spacer layer and made of a material different from the material of the spacer layer.

The spacer layer may be formed at the BOX level over the semiconductor bulk substrate of the SOI substrate. The second dielectric layer may be formed at the semiconductor layer level and may extend partially below the upper surface of the buried insulation layer.

In all of the above-described embodiments, the contact may extend into the second dielectric layer and may reach the buffer layer or the spacer layer. In fact, the buffer layer or the spacer layer protects the semiconductor bulk substrate from over-etching of a contact hole to be formed in the process of forming the contact.

Also disclosed herein is a device including an SOI substrate and an isolation structure positioned at least partially in a trench that extends through a buried insulation layer and into a semiconductor bulk substrate of the SOI substrate. The isolation structure includes a first dielectric layer positioned in a lower portion of the trench, a first material layer positioned above the first dielectric layer, the first material layer having a material different from a material of the first dielectric layer, and a second dielectric layer positioned above the first material layer, the second dielectric layer having a material different from the material of the first material layer.

BRIEF DESCRIPTION OF THE DRAWINGS

The disclosure may be understood by reference to the following description taken in conjunction with the accompanying drawings, in which like reference numerals identify like elements, and in which:

FIGS. 2a-2j show different manufacturing stages of a process of forming the semiconductor device shown in FIG. 1;

FIGS. 4a-4f show different manufacturing stages of a process of forming the semiconductor device shown in FIG. 3.

Figure 1:
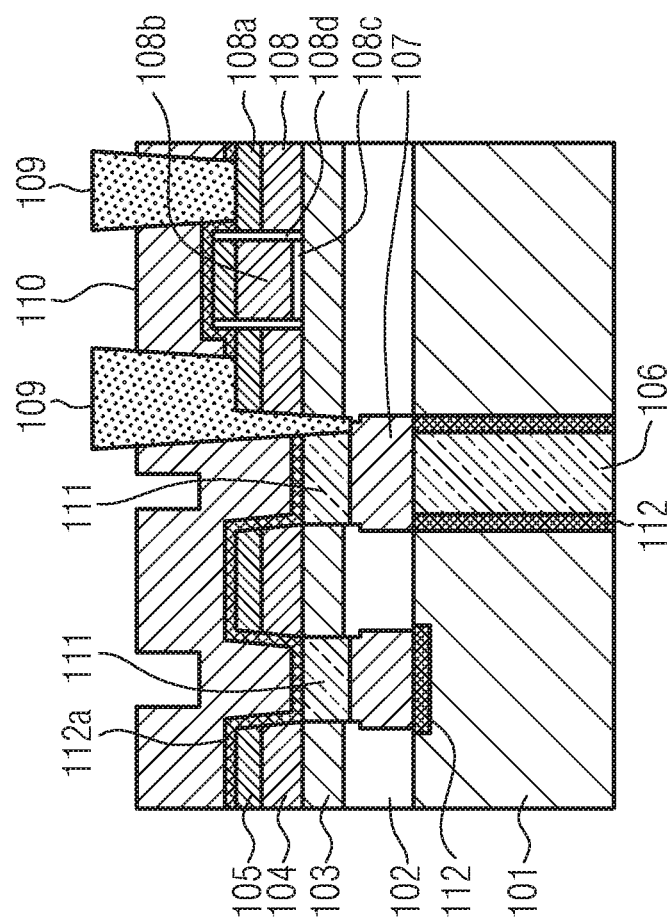
FIG. 1 illustrates a semiconductor device comprising a contact to a source/drain region of a FET and partially formed over an STI, according to an exemplary embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As will be readily apparent to those skilled in the art upon a complete reading of the present application, the present methods are applicable to a variety of technologies, for example, NMOS, PMOS, CMOS, etc., particularly in the context of fully depleted silicon-on-insulator (FDSOI) technologies used for manufacturing ICs. The manufacturing techniques may be integrated in CMOS manufacturing processes. In particular, the process steps described herein are utilized in conjunction with any semiconductor device fabrication process that forms FETs and STIs for integrated circuits, and the process is readily applicable to a variety of devices, including, but not limited to, logic devices, memory devices such as SRAM devices, etc. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor bulk substrate.

Herein, techniques of manufacturing semiconductor devices comprising FETs are provided wherein contacts to source/drain regions of the FETs can be reliably formed. In particular, the disclosed techniques allow for an arrangement of the contacts such that the contacts at least partially cover STI regions without a risk of forming an electrical short to the semiconductor bulk substrate of the SOI substrate by the contact material.

FIG. 1 illustrates a semiconductor device according to an example of the present disclosure. As shown in FIG. 1 the semiconductor device comprises an SOI substrate comprising a semiconductor bulk substrate 101, a buried insulation (e.g., silicon dioxide) layer 102 formed on the semiconductor bulk substrate and a semiconductor layer 103 formed on the buried insulation layer 102.

The bulk semiconductor bulk substrate 101 may be a silicon substrate, in particular, a single crystal silicon substrate. Other materials may be used to form the semiconductor bulk substrate such as, for example, germanium, silicon germanium, gallium phosphate, gallium arsenide, etc. The semiconductor bulk substrate 101 may comprise $N^+/P^+$ doped regions for back biasing. The buried insulation layer 102 may include a dielectric material and may have a thickness of below 50 nm, for example. The buried insulation layer 102 may comprise silicon (di)oxide, for example, borosilicate glass. The buried insulation layer 102 may be composed of different layers and one of the different layers may comprise borophosphosilicate glass (BPSG) or an $SiO_2$-compound comprising boron. The semiconductor layer 103 may provide the channel region of the FET and may be comprised of any appropriate semiconductor material, such as silicon, silicon/germanium, silicon/carbon, other II-VI or III-V semiconductor compounds and the like. The semiconductor layer 103 may have a thickness suitable for forming a fully depleted field effect transistor, for example, a thickness in a range from about 5-8 nm. For example, the thickness of the semiconductor layer 103 may be in the range of 5-20 nm, in particular, 5-10 nm, and the thickness of the buried insulation layer 102 may be in the range of 10-50 nm, in particular, 10-30 nm and, more particularly, 15-25 nm.

In a P-channel FET area of the semiconductor layer 103, an SiGe channel may be formed. For example, a compressive strained silicon-germanium channel (cSiGe) is formed in the semiconductor layer 103 of the SOI substrate by local Ge enrichment involving the epitactical formation of a compressive SiGe layer on the exposed surface of the semiconductor layer 103. The compressive silicon-germanium channel may be provided in order to enhance the mobility of charge carriers in the channel region of a P-channel FET that is to be formed in the PFET area. It is noted that epitaxy may be supplemented by a condensation anneal that drives the Ge atoms into the SOI channel and oxidizes the epitaxial SiGe at the same time.

Another semiconductor layer 104 comprising an upper silicided region 105 is formed over the semiconductor layer 103 of the SOI substrate. A shallow trench isolation (STI) is formed in the semiconductor bulk substrate 101 and a lower portion of the STI is filled with a dielectric layer 106, for example, a flowable oxide material layer. A dielectric buffer layer 107 is formed at a buried insulation level over the dielectric layer 106. The dielectric buffer layer 107 is made of a material different from the one of the dielectric layer 106 and also different from the one of the buried insulation layer 102. The dielectric buffer layer 107 may comprise a nitride material, for example, SiN. In and over the SOI substrate, a FET 108 is formed. The FET 108 comprises source/drain regions 108a, a silicided gate electrode 108b, a gate dielectric 108c and sidewall spacers 108d.

The raised source and drain regions 108a may be formed, for example, by epitaxial growth. The gate electrode 108b may comprise metal gate and polysilicon gate materials. The material of the metal gate may include La, AL or TiN, for example.

The metal gate may include a work function adjusting material, for example, TiN. In particular, the metal may comprise a work function adjusting material that comprises an appropriate transition metal nitride, for example, those from Groups IV-VI in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN), and the like, with a thickness of about 1-60 nm. Moreover, the effective work function of the metal gate can be adjusted by added impurities, for example, Al, C or F. Atop of the metal gate, the poly gate may be formed.

The gate electrode 108b is separated from the semiconductor layer 103 of the FDSOI substrate by the gate dielectric 108c. The gate dielectric 108c may comprise a high-k material layer with a dielectric constant k of above 4. The high-k material layer may comprise a transitional metal oxide, such as at least one of hafnium oxide, hafnium dioxide and hafnium silicon-oxynitride, and may be directly formed on the semiconductor layer of the FDSOI substrate.

Contact structures (CA contacts) 109 formed in a dielectric layer 110 electrically contact the raised silicided source/drain regions 108a of the FET 108. It should be noted that a (CB) contact to the gate electrode 108b may also be formed in the dielectric layer 110. The contacts are electrically isolated from each other. The dielectric layer 110 may comprise or consist of a plasma enhanced nitride (PEN) layer. In particular, the dielectric layer 110 may be an interlayer dielectric (ILD). An oxide layer 111 is formed on the dielectric buffer layer 107 in an upper portion of the STI and additional oxide layers 112 are formed between the dielectric buffer layer 107 and the semiconductor bulk substrate 101 outside of the trench of the STI and between the dielectric layer 106 and the semiconductor bulk substrate 101 in the trench of the STI. Furthermore, an oxide layer 112a is formed below the dielectric layer 110.

Different from the art, the dielectric buffer layer 107 formed in the STI protects the semiconductor bulk substrate 101 during the process of etching the contact hole (selective oxide etch) in which the CA contact structure 109 to the source/drain region positioned adjacent to the STI is formed. Since over-etching can be prevented, there is no risk of forming an electrical short to the semiconductor bulk substrate 101 by the contact material filled in the etched contact hole.

The formation of the semiconductor device shown in FIG. 1 is now described with reference to FIGS. 2a-2j. The disclosed techniques can be suitably used in manufacturing of semiconductor devices on below 22 nm platforms, for example, 12 nm platforms designed for the manufacture of FDSOI devices.

As shown in FIG. 2a, an SOI substrate comprising a semiconductor bulk substrate 201, a buried insulation (BOX) layer 202 and a semiconductor layer 203 is provided. An oxide layer (pad oxide) 204 is formed on the SOI substrate and a nitride layer (pad nitride) 205 is formed on the oxide layer 204. For example, the nitride layer 205 may be made of $Si_3N_4$, SiON or a combination thereof and it may have a thickness of about 30-70 nm. Alternatively, a silicon carbide layer may be formed on the oxide layer 204. The nitride layer 205 may be formed by chemical vapor deposition, plasma enhanced chemical vapor deposition, or low pressure chemical vapor deposition. Another oxide layer 206 is formed on the nitride layer 205 and another layer 207, for example, a nitride layer, is formed on the oxide layer 206. In order to carry out a lithography process, a mask comprising a spin-on-hard mask (SOH) layer 208 and an SiON layer 209 is formed on the layer 207.

A photoresist 210 is formed on the mask layer. A bottom anti-reflective coating (BARC) layer (not shown in FIG. 2a) may be comprised by the photoresist 210. The mask layer is patterned by means of the photoresist 210 and, based on the patterned mask layer, an etch process is performed in order to define active regions. The etch process stops at the buried insulation layer 202. FIG. 2b shows the resulting structure after stripping of the mask layer. A conventional lithography-etch-lithography-etch process (LELE approach) that may include an additional "memory layer," for example, an oxide layer, formed on top of the SOH—SiON stack may be followed to obtain the structure shown in FIG. 2b and a trench of an STI (see below).

A thin oxide layer (not shown) may be formed at sidewalls of the etched recesses and a liner 212 is formed on the thin oxide layer (see FIG. 2c). The thin oxide layer may have a thickness of about 2 nm. For example, the liner 212 may be formed of or comprise a nitride material, such as $Si_3N_4$ or SiON, and it may have a thickness of about 2-8 nm. The liner 212 may be formed by plasma enhanced chemical vapor deposition or low pressure chemical vapor deposition. The liner 212 protects the active region in the semiconductor layer 203 during a steam anneal processing performed at a later stage. After deposition of the liner 212 over the sidewalls of the recesses, another etch process is performed that stops at the semiconductor bulk substrate 201, thereby forming a shallow trench. The resulting structure is shown in FIG. 2c. By means of another lithography processing step, a trench 213 is formed (self-aligned with the shallow trench) in the semiconductor bulk substrate (see FIG. 2d). The trench 213 may have a depth of more than 100 nm, for example, about 200 nm.

As shown in FIG. 2e, oxide layers 214 and 215 may be formed, for example, by oxidation of the semiconductor material of the semiconductor bulk substrate 201. These oxide layers 214, 215 prevent charge trapping between the semiconductor material of the semiconductor bulk substrate 201 and nitride materials formed in a later stage (see description below).

In the manufacturing stage shown in FIG. 2f, the recesses and the trench 213 are filled by a flowable dielectric material 216 in order to form a lower portion of an STI. The flowable dielectric material 216 is, for example, a flowable oxide material that may comprise silicon oxide or SiONH and may be formed by flowable chemical vapor deposition (FCVD). At the moment of deposition, the flowable dielectric material 216 has fluid characteristics similar to spin-on-glass films and, therefore, it shows excellent gap filling capability. The flowable dielectric material 216 may be formed by using a spin-on dielectric (SOD) formation process, or by depositing a flowable dielectric by a chemical vapor deposition (CVD) process, such as radical-component CVD. Excessive flowable dielectric material 216 formed on the layer 207 is removed, for example, by chemical mechanical polishing (CMP). During the CMP process, the layer 207 serves as a planarization stop layer.

The flowable dielectric fill is followed by a steam anneal. The steam anneal is performed either in the same process chamber used for the deposition of the flowable dielectric material 216 or in another process chamber. The steam anneal results in shrinking and densification of the dielectric material 216. The steam anneal may be performed for some minutes to some hours and at a temperature of some hundred ° C., for example. The anneal process may be performed at a temperature in a range of about 150-800° C. According to one example, the anneal process may start at about 150° C. and ramp up the temperature gradually to a predetermined temperature of about 500-800° C. The pressure of the anneal process may be in a range of about 500-800 Torr. The flow rate of steam may be in a range of about 1-2 slm (standard-liter per meter). The duration of the steam thermal anneal process may, particularly, be in a range from about 20 minutes to about 2 hours.

As shown in FIG. 2g, oxide removal down to or near the level of the upper surface of the semiconductor bulk substrate 201 is performed that may be followed by a removal of the nitride layer 212. In the manufacturing stage shown in FIG. 2h, the recesses are filled by a nitride material 217. The nitride material is recessed to a level below the lower surface of the semiconductor layer 203 (see FIG. 2i). This recess can be obtained by a wet hot phosphor etch during which the oxide layer 206 and, particularly, the liner 212 protects the pad nitride 205. Alternatively, the nitride material 217 may be recessed by means of reactive ion etching (RIE). The recess results in nitride buffer layers 217a, in particular, a nitride buffer layer 217a in the STI. Due to the different oxide layers, any direct contact between the nitride buffer layers 217a and the semiconductor material of the semiconductor bulk substrate 201 is avoided.

In the manufacturing stage shown in FIG. 2j, an oxide material 218 is formed on the nitride buffer layers 217a to form an upper portion of an STI. For example, the oxide material 218 is not a flowable dielectric material and it may be a high-density plasma oxide formed by high-density plasma chemical vapor deposition and it may comprise a silicon oxide. Excessive oxide material 218 may be removed by chemical mechanical polishing. In particular, the oxide material 218 may be the same as the material of the buried insulation layer 202 of the SOI substrate.

Formation of the FET 108 and the contacts 109, etc. may be performed as known in the art to obtain the semiconductor device shown in FIG. 1. In principle, the CA contact structures 109 shown in FIG. 1 could be formed by depositing a liner made of Ti or TiN, for example, followed by filling the contact holes with a conductive material, for example, tungsten, and followed by performing a CMP process to remove excessive material of the CA contact structures.

Different from the art, the nitride buffer layer formed in the STI (see reference numbers 217a in FIGS. 2j and 107 in FIG. 1) prevents over-etching into the semiconductor bulk substrate 101, 201 when forming a contact hole for the contact 109 contacting a source/drain region 108a of the FET 108 close to the STI (see FIG. 1).

Figure 3:
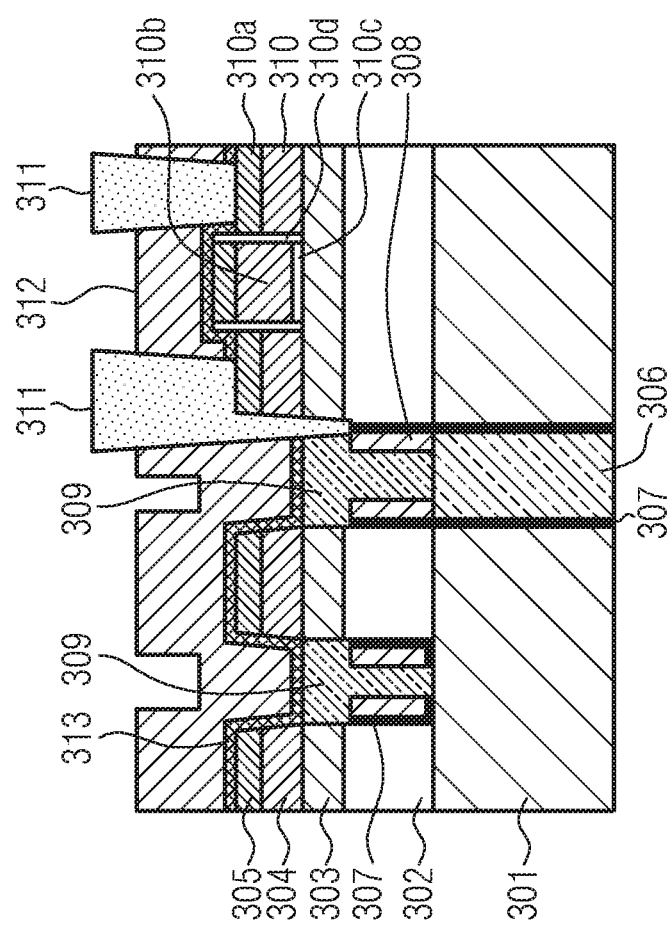
FIG. 3 illustrates a semiconductor device comprising a contact to a source/drain region of a FET and partially formed over an STI, according to another exemplary embodiment.

FIG. 3 illustrates a semiconductor device according to another exemplary embodiment. As shown in FIG. 3, the semiconductor device comprises an SOI substrate comprising a semiconductor bulk substrate 301, a buried insulation (BOX) layer 302 formed on the semiconductor bulk substrate and a semiconductor layer 303 formed on the buried insulation layer 302. The SOI substrate may be similar to the one described above with reference to the embodiment illustrated in FIG. 1.

Another semiconductor layer 304 comprising an upper silicided region 305 is formed over the semiconductor layer 303 of the SOI substrate. A lower portion of a shallow trench isolation (STI) formed in the semiconductor bulk substrate 301 is filed with a dielectric layer 306. A dielectric liner 307 is formed in the STI at the levels of the semiconductor bulk substrate 301 and the buried insulation layer 302. The dielectric liner 307 may comprise a nitride material, for example, SiN. A spacer layer 308, for example, a nitride layer, is also formed in the STI. A dielectric material 309, for example, an oxide material, is formed in an upper portion of the STI. In and over the SOI substrate, a FET 310 is formed. The FET 310 comprises source/drain regions 310a, a silicided gate electrode 310b, a gate dielectric 310c and sidewall spacers 310d. CA contacts 311 are formed in a dielectric layer 312, for example, a plasma enhanced nitride layer, for electrically contacting the source/drain regions 310a of the FET 310. In particular, the dielectric layer 312 may be an interlayer dielectric (ILD). An oxide layer 313 is formed below the dielectric layer 312.

Different from the art, the spacer layer 308 formed in the STI protects the semiconductor bulk substrate 301 during the process of etching the contact hole (selective oxide etch) in which the CA contact structure 311 close to the STI is formed. Since over-etching may be prevented, there is no risk of forming an electrical short to the semiconductor bulk substrate 301 by the contact material that is filled in the etched contact hole in order to form the contact 311.

The formation of the semiconductor device shown in FIG. 3 is now described with reference to FIGS. 4a-4f. The disclosed techniques may be suitably used in manufacturing of semiconductor devices on below 22 nm platforms, for example, 12 nm platforms designed for the manufacture of FDSOI devices.

The process flow described above with reference to FIGS. 2a-2b is also carried out in this embodiment with the exception that the etching process stops at the surface of the semiconductor bulk substrate 401. An SOI substrate similar to the one described with reference to FIG. 2a is provided (see FIG. 4a). The SOI substrate comprises a semiconductor bulk substrate 401, a buried insulation (BOX) layer 402 and a semiconductor layer 403. An oxide layer (pad oxide) 404 is formed on the SOI substrate and a nitride layer (pad nitride) 405 is formed on the oxide layer 404. For example, the nitride layer 405 may be made of $Si_3N_4$, SiON or a combination thereof and it may have a thickness of about 30-70 nm. Alternatively, a silicon carbide layer may be formed on the oxide layer 404. The nitride layer 405 may be formed by chemical vapor deposition, plasma enhanced chemical vapor deposition, or low pressure chemical vapor deposition. Another oxide layer 406 is formed on the nitride layer 405 and another layer 407, for example, a nitride layer, is formed on the oxide layer 406. A trench 408 is formed in the entire stack and two recesses 409 are formed down to the level of the upper surface of the semiconductor bulk substrate 401 of the SOI substrate.

In the manufacturing step shown in FIG. 4b, a liner 410 is formed over sidewalls of the trench 408 and the recesses 409. The liner 410 may be formed on a thin oxide layer (not shown in FIG. 4b) and it may comprise or consist of an oxide or carbide material. The trench 408 and the recesses 409 are filled by a flowable dielectric material 411 in order to form a lower portion of an STI. The flowable dielectric material 411 is, for example, a flowable oxide material that may comprise silicon oxide or SiONH and may be formed by flowable chemical vapor deposition (FCVD). Excessive flowable dielectric material 411 formed on the layer 407 is removed, for example, by chemical mechanical polishing (CMP). During the CMP process, the layer 407 serves as a planarization stop layer. The flowable dielectric fill is followed by a steam anneal, for example, a steam anneal similar to the one described above with reference to FIG. 2f.

Figure 4D:
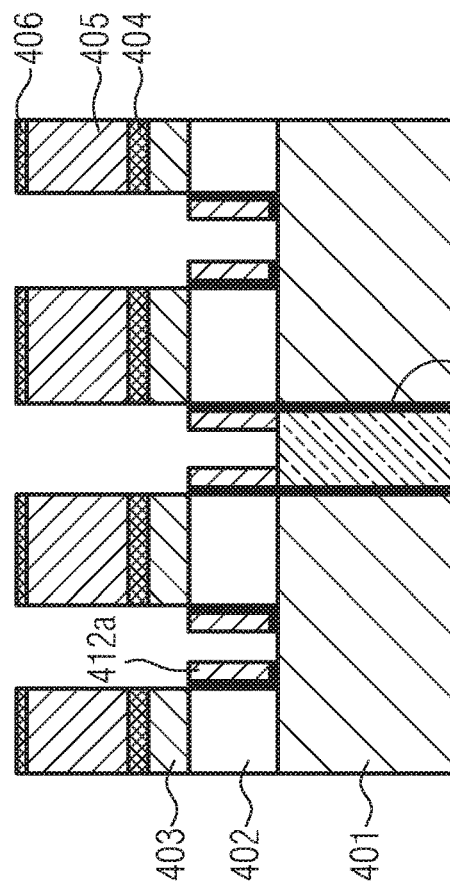
Figure 4C:
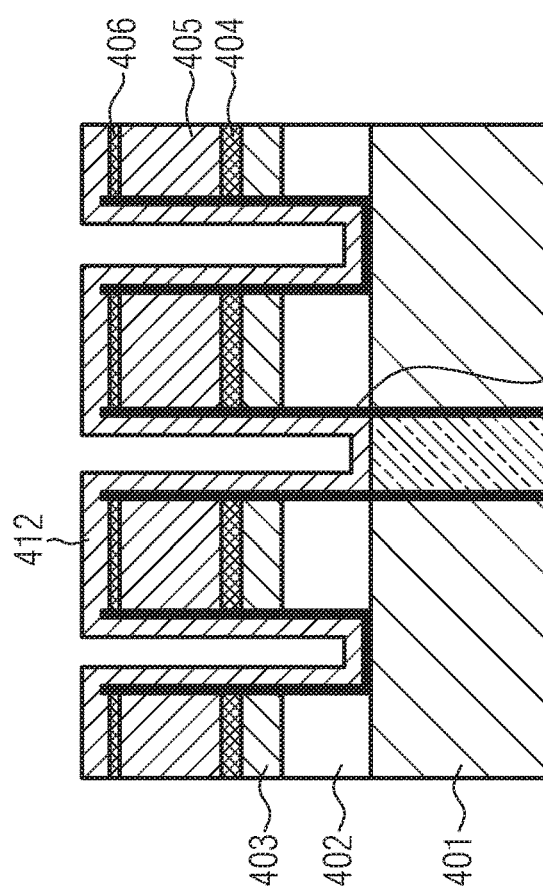

As shown in FIG. 4c, an oxide removal down to or near to the level of the upper surface of the semiconductor bulk substrate 401 is performed. In the manufacturing stage shown in FIG. 4c, a spacer layer 412 is formed in the recesses resulting from the oxide removal. The spacer layer 412 may comprise or consist of a nitride material. The deposited spacer layer 412 is etched to obtain spacers 412a, as shown in FIG. 4d. The etching may comprise a long anisotropic RIE process, wherein the oxide layer 406 serves as a protection layer against the anisotropic attack of the nitride layer 405. In particular, spacers 412 are formed on the lower portion (formed in the semiconductor bulk substrate 401) of an STI filled with the flowable dielectric material 411. It is noted that the spacers 412a have no direct contact to active regions. During the process of etching of the spacer layer 412a, portions of the liner 410 are also removed.

In the manufacturing stage shown in FIG. 4e, an oxide material 413 is filled in the recesses to form an upper portion of the STI. For example, the oxide material 413 is not a flowable dielectric material and it may be a high-density plasma oxide formed by high-density plasma chemical vapor deposition and it may comprise a silicon oxide. Excessive oxide material 413 may be removed by chemical mechanical polishing. In particular, the oxide material 413 may be the same as the material of the buried insulation layer 402 of the SOI substrate. The layer 405 and an upper portion of the oxide material 413 are removed as it is shown in FIG. 4f. Formation of the FET and the contacts, etc. can be performed as known in the art to obtain the semiconductor device shown in FIG. 3.

In all of the above-described embodiments, the CA contact directly contacts the source/drain region of the FET. It has to be noted, however, that the described process flows may be integrated in the procedure of contacting a source/drain region via a trench silicide (TS) structure. Formation of the TS structures may comprise forming trenches in the dielectric layer 110 of FIG. 1 or the dielectric layer 312 of FIG. 3 thereby exposing portions of the underlying source/drain regions. Thereafter, some metal silicide can be formed in the thus formed trenches and, subsequently, tungsten or any other suitable material can be formed on the metal silicide.

As a result, the present disclosure provides SOI semiconductor devices comprising FETs with source/drain regions that are reliably contacted without electrical shorts to the semiconductor bulk substrate.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
an SOI substrate comprising a semiconductor bulk substrate, a buried insulation layer positioned on said semiconductor bulk substrate and a semiconductor layer positioned on said buried insulation layer;
a trench formed in said SOI substrate, said trench extending through said buried insulation layer and into said semiconductor bulk substrate; and
an isolation structure positioned at least partially in said trench, said isolation structure comprising:
a first dielectric layer positioned in a portion of said trench that extends into said bulk semiconductor substrate;
a first material layer positioned above said first dielectric layer, said first material layer being made of a material that is different from a material of said first dielectric layer;
a second dielectric layer positioned above said first material layer, said second dielectric layer being made of a material that is different from said material of said first material layer; and
a liner layer positioned in said trench on said bulk semiconductor substrate and on said buried insulation layer, wherein said first material layer is positioned within said liner layer,
wherein said first material layer is a spacer that comprises an opening that exposes a portion of an upper surface of said first dielectric layer.

2. The device of claim 1, wherein said first dielectric layer comprises silicon dioxide, said first material layer comprises silicon nitride and said second dielectric layer comprises an oxide material.

3. The device of claim 1, wherein said first dielectric layer comprises an upper surface that is substantially coplanar with an upper surface of said bulk semiconductor substrate.

4. The device of claim 1, wherein said buried insulation layer comprises an upper surface and said first material layer comprises an upper surface, and wherein said upper surface of said first material layer is positioned at a level that is below a level of said upper surface of said buried insulation layer.

5. The device of claim 1, wherein said second dielectric layer comprises an upper surface that is substantially coplanar with an upper surface of said semiconductor layer.

6. The device of claim 1, further comprising a liner layer positioned in said portion of said trench that extends into said bulk semiconductor substrate, wherein said first dielectric layer is positioned within said liner layer.

7. The device of claim 1, wherein said first material layer covers an entire upper surface of said first dielectric layer and said second dielectric layer covers an entire upper surface of said first material layer.

8. The device of claim 1, wherein a portion of said second dielectric layer is positioned in said opening in said first material layer and said second dielectric layer contacts said upper surface of said first dielectric layer.

9. A device, comprising:
an SOI substrate comprising a semiconductor bulk substrate, a buried insulation layer positioned on said semiconductor bulk substrate and a semiconductor layer positioned on said buried insulation layer;

a trench formed in said SOI substrate, said trench extending through said buried insulation layer and into said semiconductor bulk substrate; and an isolation structure positioned at least partially in said trench, said isolation structure comprising:

a first dielectric layer positioned in a portion of said trench that extends into said bulk semiconductor substrate, said first dielectric layer comprising a first upper surface that is substantially coplanar with an upper surface of said bulk semiconductor substrate;

a first material layer positioned above said first dielectric layer, said first material layer being made of a material that is different from a material of said first dielectric layer, said first material layer comprising an upper surface, wherein said upper surface of said first material layer is positioned at a level that is below a level of an upper surface of said buried insulation layer;

a second dielectric layer positioned above said first material layer, said second dielectric layer being made of a material that is different from said material of said first material layer; and a liner layer positioned in said trench on said bulk semiconductor substrate and on said buried insulation layer, wherein said first material layer is positioned within said liner layer, wherein said first material layer is a spacer that comprises an opening that exposes a portion of an upper surface of said first dielectric layer and wherein a portion of said second dielectric layer is positioned in said opening in said first material layer and said second dielectric layer contacts said upper surface of said first dielectric layer.

10. The device of claim 9, wherein said second dielectric layer comprises an upper surface that is substantially coplanar with an upper surface of said semiconductor layer.

11. The device of claim 9, further comprising a liner layer positioned in said portion of said trench that extends into said bulk semiconductor substrate, wherein said first dielectric layer is positioned within said liner layer.

12. The device of claim 9, wherein said first material layer covers an entire upper surface of said first dielectric layer and said second dielectric layer covers an entire upper surface of said first material layer.

* * * * *